(12) United States Patent
Kehrer et al.

(10) Patent No.: US 7,576,619 B2
(45) Date of Patent: Aug. 18, 2009

(54) INTEGRATED CIRCUIT ARRANGEMENT

(75) Inventors: Daniel Kehrer, Hartkirchen (AT);
Herbert Knapp, Munich (DE)

(73) Assignee: Infineon Technologies AG, Munich (DE)

( * ) Notice: Subject to any disclaimer, the term of this patent is extended or adjusted under 35 U.S.C. 154(b) by 575 days.

(21) Appl. No.: 10/520,805

(22) PCT Filed: Jul. 11, 2003

(86) PCT No.: PCT/DE03/02349

§ 371 (c)(1),
(2), (4) Date: Oct. 13, 2005

(87) PCT Pub. No.: WO2004/010501

PCT Pub. Date: Jan. 29, 2004

(65) Prior Publication Data

US 2006/0232349 A1    Oct. 19, 2006

(51) Int. Cl.
*H03B 1/04*    (2006.01)
*H03K 19/003*   (2006.01)
*H03K 19/0175*  (2006.01)

(52) U.S. Cl. .................. 331/77; 331/105; 326/21; 326/62; 327/564; 330/192; 330/252

(58) Field of Classification Search .............. 326/21, 326/26–28, 62, 82–92; 327/108–112, 365, 327/379–381, 551, 564–566; 330/192, 252; 331/74–77, 105
See application file for complete search history.

(56) References Cited

U.S. PATENT DOCUMENTS 4,791,326 A * 12/1988 Vajdic et al. ............... 327/391
6,323,735 B1   11/2001 Welland et al.

FOREIGN PATENT DOCUMENTS

| DE | 2809498 | 3/1978 |
| DE | 0735656 | 10/1996 |
| EP | 0 410 7940 | 4/1992 |
| EP | 0 574 180 | 12/1993 |
| WO | 00/51012 | 8/2000 |

OTHER PUBLICATIONS

Masakazu Yamashina et al., An MOS Current Mode Logic (MCML) Circuit for Low-Power GHz Processors, NEC Res. & Develop., 36, No. 1 (1995), pp. 54-62.
Z. Lao et al., 40-Gb/s High-Power Modulator Driver IC for Lightwave Communication Systems, IEEE Journal of Solid-State Circuits, 33, No. 10 (1998), pp. 1520-1526.
International Search Report having International Application No. PCT/DE 03/02349 mailed on Dec. 12, 2003.

* cited by examiner

*Primary Examiner*—David Mis
(74) *Attorney, Agent, or Firm*—Dicke, Billig & Czaja, PLLC

(57) ABSTRACT

An integrated circuit arrangement is disclosed. In one embodiment, the integrated circuit arrangement includes an output circuit having at least one first output connection which can provide a data signal, at least one first data output connection; and at least one first inductance connected between the at least one first output connection and the at least one data output connection.

18 Claims, 5 Drawing Sheets

US 7,576,619 B2

INTEGRATED CIRCUIT ARRANGEMENT

CROSS REFERENCE TO RELATED APPLICATIONS

This Utility Patent Application claims the benefit of the filing date of Application No. DE 102 31 638.4, filed Jul. 12, 2002 and International Application No. PCT/DE03/02349, filed Jul. 11, 2003, both of which are herein incorporated by reference.

FIELD OF THE INVENTION

The invention relates to an integrated circuit arrangement.

BACKGROUND

With the increasing scope of data transmissions and the increasing clock frequencies of computers, circuits which have a relatively high bandwidth are needed. In integrated output driver circuits, the usable bandwidth is usually limited by parasitic capacitances, such as by parasitic capacitances in a data output connection (pad), and by inductances in an output line (bondwire) which is normally connected to the pad.

To increase the bandwidth, the prior art involves attempts to keep the parasitic capacitances as small as possible, since this makes it possible to achieve an increase in the available bandwidth. Circuit arrangements based on the prior art are designed using CML technology, inter alia An MOS Current Mode Logic (MCML) Circuit for Low-Power GHz Processors, M. Yamashina and H. Yamada, NEC Res. & Develop., 36, No. 1 (1995), pp. 54-62.

A second approach to increasing the available bandwidth based on the prior art is to use "peaking coils" 40-Gb/s High-Power Modulator Driver IC for Lightwave Communication Systems, Z. Lao et al., IEEE Journal of Solid-State Circuits, 33, No. 10 (1998), pp. 1520-1526. Peaking coils are coils (inductances) which are arranged in the power supply part of an output circuit. As when designing a circuit to have the smallest possible parasitic capacitances, these increase the usable bandwidth of an output circuit. A schematic output circuit in a differential amplifier having integrated peaking coils based on the prior art is shown in FIG. 7.

FIG. 7 illustrates an equivalent circuit diagram of an integrated circuit arrangement 50 based on the prior art which has a differential amplifier 51 as an output stage. A first data input 1 on the differential amplifier 51 is coupled to the gate of a first transistor 2, whose first source/drain region is coupled to a first node 3 and whose second source/drain region is coupled to a second node 4. The second node 4 forms a first output connection on the differential amplifier 51. The first node 3 is coupled to a connection on a current source 5 and to a first source/drain region of a second transistor 6. The gate of the second transistor 6 is coupled to a second data input 7, which second data input is differential with respect to the first data input 1. The second source/drain region of the second transistor 6 is coupled to a third node 8. The third node 8 forms a second output connection on the differential amplifier 51. The second node 4 is coupled to a first peaking coil 9 and to a first line 10, which forms a first line 10 from the first output connection 4 of the differential amplifier 51 to a first data output connection (pad) 52. The first peaking coil 9 is also coupled to a connection on a voltage source 53 by means of a first resistor 11. The third node 8 is coupled to a second peaking coil 12 and to a second line 13, which forms a second line 13 from the second output connection 8 of the differential amplifier 51 to a second data output connection (pad) 54. The second peaking coil 12 is also coupled to the second connection of the voltage source by means of a second resistor 14.

The first output connection 4 of the differential amplifier 51 is coupled to a fourth node 15. The fourth node 15 is coupled to a first capacitance 16, which essentially represents the parasitic capacitances of the output circuit (transistor 2). In addition, the fourth node 15 is coupled to a fifth node 17. The fifth node 17 is coupled to a second capacitance 18, which essentially represents the parasitic capacitances of the first data output connection 52. In addition, the fifth node 17 is coupled to a first data output 19.

The second output connection 8 of the differential amplifier 51 is coupled to a sixth node 20. The sixth node 20 is coupled to a third capacitance 21, which essentially represents the parasitic capacitances of the output circuit (transistor 6). In addition, the sixth node 20 is coupled to a seventh node 22. The seventh node 22 is coupled to a fourth capacitance 23, which essentially represents the parasitic capacitances of the second data output connection 54. In addition, the seventh node 22 is coupled to a second data output 24.

Even when using peaking coils, however, the parasitic capacitances of the data output connections 52, 54 cause a reduction in the usable bandwidth to a value below the intrinsic bandwidth of the circuit. That is to say that the usable bandwidth of the circuit is smaller than would be achievable with the type of components which is used if no parasitic capacitances were to arise.

DE 696 16 126 T2 discloses a method for stabilizing a power converter in the face of oscillations which are caused by mismatches between the setting value for an output voltage and an available large number of quantized work cycles.

DE 28 09 498 C2 discloses an operation monitoring system for radar installations with a monitoring reception device (situated close to the radar antenna) for obtaining a sample of the transmitted signal from the radar transmitter.

There is a need to increase the available bandwidth in an output circuit. For these and other reasons, there is a need for the present invention.

SUMMARY

An integrated circuit arrangement based on the invention has an output circuit having at least one first output connection and at least one first data output connection. The at least first output connection and the at least first data output connection have an inductance connected between them.

The circuit arrangement based on the invention is used to produce a circuit arrangement which provides a greater usable bandwidth for data signals. This is done by means of the advantageous production of a series inductance in a path of the circuit which couples the at least first output connection to the at least first data output connection. This inductance clearly forms, together with a parasitic capacitance in the data output connection, a filter which increases the usable bandwidth of the circuit arrangement.

In one embodiment, the output circuit of the inventive circuit arrangement has a second output connection. In addition, the circuit arrangement has a second data output connection, with the second data output connection and the second output connection having at least one second inductance connected between them.

In one embodiment, the first inductance of the inventive circuit arrangement is in a form such that it forms a first frequency filter, which has a prescribed frequency band, together with the first data output connection, and the second inductance of the inventive circuit arrangement is in a form such that it forms a second frequency filter, which has the prescribed frequency band, together with the second data output connection. This is achieved by virtue of the interposed first inductance and the interposed second inductance being in a form such that the filters produced in connection with the capacitances in the first and second data output connections have a resonant frequency which corresponds to the frequency band used in the circuit arrangement.

In one embodiment, the filter is set up such that the prescribed frequency band is in the range from 1 GHz to 100 GHz. With particular preference, the filter is set up such that the frequency band is in the range from 10 GHz to 20 GHz.

In one embodiment, if a plurality of parasitic capacitances have been produced in the integrated circuit arrangement, a filter is produced by means of each parasitic capacitance and by means of a corresponding inductance. The integrated circuit arrangement then has a plurality of frequency filters, which are coupled in series, between the at least first output connection and the at least first data output connection. The frequency filters are respectively formed from an inductance and a parasitic capacitance, which are caused by electronic components which have been coupled into the connection between the output connection of the output circuit and the data output connection. These may be electrostatic discharge (ESD) apparatuses, for example, which are used to protect the integrated circuit arrangement from external charges.

In one embodiment, the output circuit is set up such that a differential signal can be provided on the first output connection and on the second output connection.

In one embodiment, the output circuit provides, on the first output connection and on the second output connection, a differential signal which couples the at least one first inductance to the at least one second inductance.

By coupling two respective inductances, with a first inductance being connected in the coupling between the first output connection and the first data output connection, and a second inductance being connected in the coupling between the second output connection and the second data output connection, a differential signal results in the advantage that the two data signals respectively have the two inductances available. This results in it being possible to produce the same inductance with a smaller available chip area. This allows a considerable amount of chip area to be saved.

In one embodiment, at least one inductance is a monolithically integrated inductance. With particular preference, all inductances are in the form of monolithically integrated inductances.

In one embodiment, the output circuit in the integrated circuit arrangement may be any broadband output stage. In one embodiment, the output circuit has a differential amplifier or a multiplexer.

Exemplary embodiments of the invention are illustrated in the figures and are explained in more detail below.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
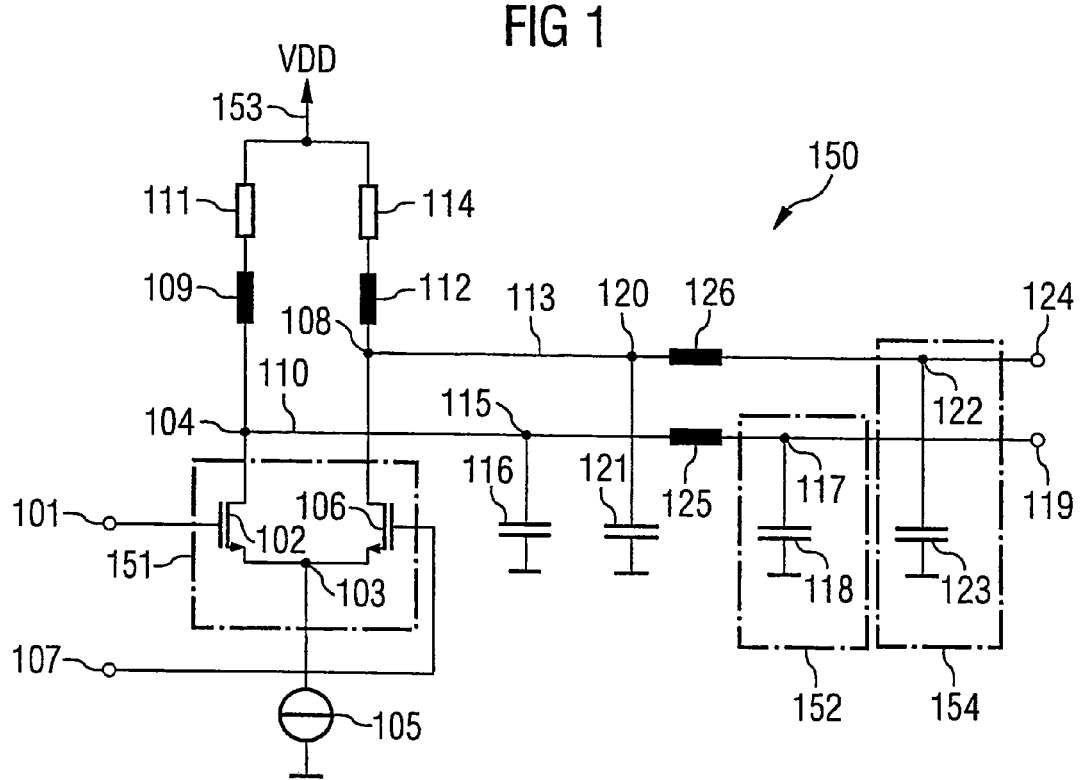
FIG. 1 illustrates a schematic diagram of a circuit arrangement based on a first exemplary embodiment of the invention.

FIG. 1 illustrates a first exemplary embodiment of an integrated circuit arrangement 150 which has a CMOS-based differential amplifier 151 as output stage. A first data input 101 on the differential amplifier 151 is coupled to the gate of a first transistor 102, whose first source/drain region is coupled to a first node 103 and whose second source/drain region is coupled to a second node 104. The second node 104 forms a first output connection for the differential amplifier 151. The first node 103 is coupled to a connection on a current source 105 and to a first source/drain region on a second transistor 106. The gate of the second transistor 106 is coupled to a second data input 107, which second data input 107 is differential with respect to the first data input 101. The second source/drain region of the second transistor 106 is coupled to a third node 108. The third node 108 forms a second output connection for the differential amplifier 151. The second node 104 is coupled to a first peaking coil 109 and to a first line 110, which forms a first line 110 from the first output connection 104 of the differential amplifier 151 to a first data output connection (pad) 152. The first peaking coil 109 is also coupled to a connection on a voltage source 153 by means of a first resistor 111. The third node 108 is coupled to a second peaking coil 112 and to a second line 113, which forms a second line 113 from the second output connection 108 of the differential amplifier 151 to a second data output connection (pad) 154. The second peaking coil 112 is also coupled to the connection of the voltage source 153 by means of a second resistor 114.

The first output connection 104 of the differential amplifier 151 is coupled to a fourth node 115. The fourth node 115 is coupled to a first capacitance 116, which essentially represents the parasitic capacitances of the output circuit (transistor 102). In addition, the fourth node 115 is coupled to a first series-connected, monolithic inductance 125. The first series-connected, monolithic inductance 125 is coupled to a fifth node 117. The fifth node 117 is coupled to a second capacitance 118, which essentially represents the parasitic capacitances of the first data output connection 152. In addition, the fifth node 117 is coupled to a first data output 119.

The second output connection 108 of the differential amplifier 151 is coupled to a sixth node 120. The sixth node 120 is coupled to a third capacitance 121, which essentially represents the parasitic capacitances of the output circuit (transistor 106). In addition, the sixth node 20 is coupled to a second series-connected, monolithic inductance 126. The second series-connected, monolithic inductance 126 is coupled to a seventh node 122. The seventh node 122 is coupled to a fourth capacitance 123, which essentially represents the parasitic capacitances of the second data output connection 154. In addition, the seventh node 122 is coupled to a second data output 124.

The first capacitance 116, the second capacitance 118 and the first series inductance 125 together form a first π filter. The third capacitance 121, the fourth capacitance 123 and the second series inductance 126 together form a second π filter. These π filters are used to increase the usable bandwidth of the output circuit (differential amplifier).

In an exemplary embodiment which is designed for a frequency of 20 GHz, for an output impedance of 50Ω, the two peaking coils 109 and 112 each have an inductance of 0.25 nH, the parasitic capacitances of the transistors 102 and 106 are 50 fF, and the two series inductances 125 and 126 have an inductance of 0.15 nH.

The inventive disclosure may be applied to all broadband output circuits to increase the bandwidth of the output circuit.

Figure 2:
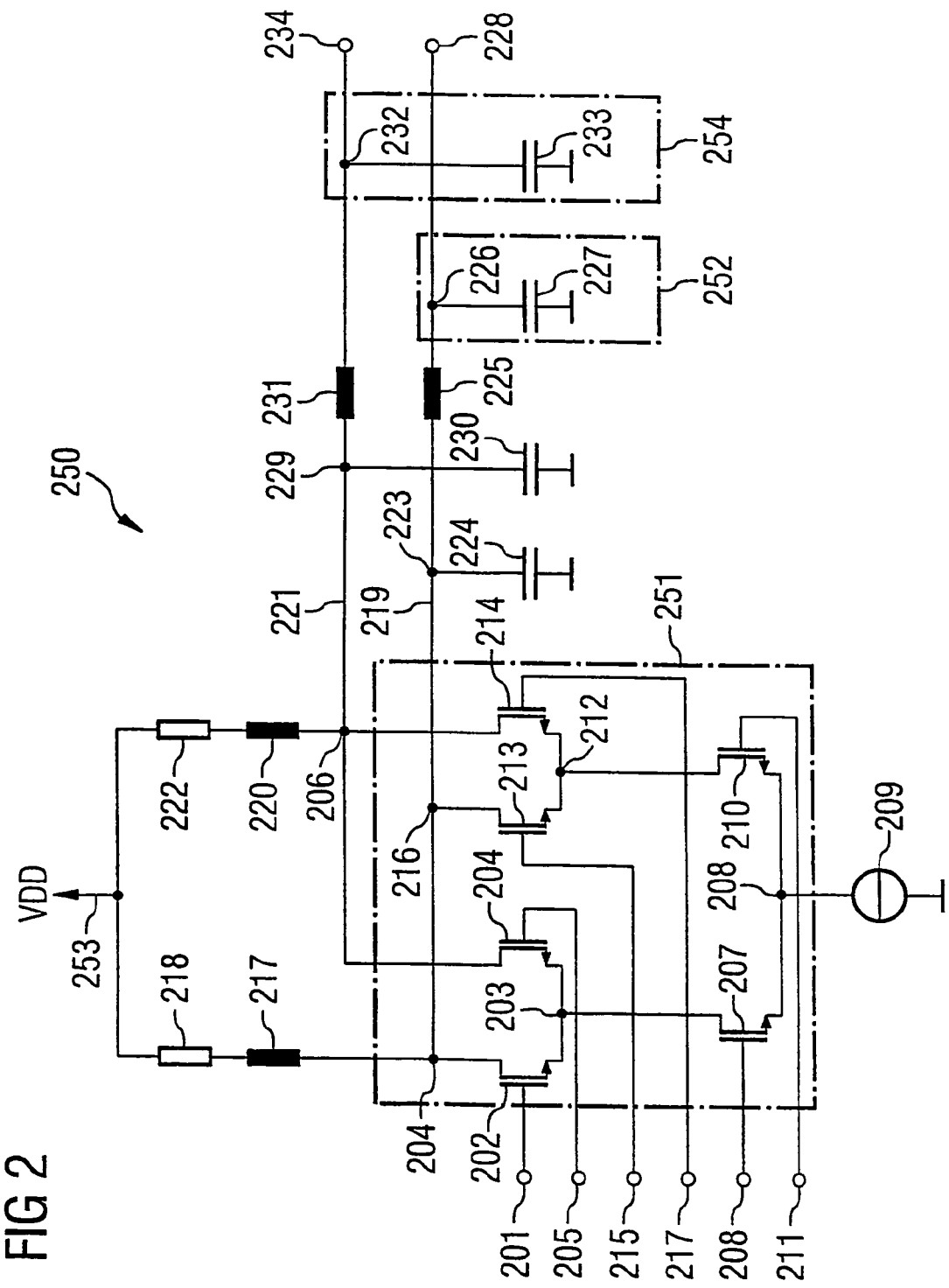
FIG. 2 illustrates a schematic diagram of a circuit arrangement based on a second exemplary embodiment of the invention.

As a second exemplary embodiment of the invention, FIG. 2 illustrates the equivalent circuit diagram of a CMOS-based multiplexer 251 as an output stage for the circuit arrangement 250, the output connection of said multiplexer containing inventive series-connected, monolithic inductances.

A first data input 201 is coupled to the gate of a first transistor 202, whose first source/drain region is coupled to a first node 203 and whose second source/drain region is coupled to a second node 204. The first node 203 is coupled to a first source/drain region of a second transistor 204. The gate of the second transistor 204 is coupled to a second data input 205, which is differential with respect to the first data input 201. A second source/drain region of the second transistor 204 is coupled to a sixth node 206. In addition, the first node 203 is coupled to a first source/drain region of a third transistor 207. The gate of the third transistor 207 is coupled to a first clock input 208. The second source/drain region of the third transistor 207 is coupled to a third node 208. The third node 208 is coupled to a connection on a current source 209 and to a first source/drain region of a fourth transistor 210. The gate of the fourth transistor 210 is coupled to a second clock input 211, which second clock input 211 is differential with respect to the first clock input 208. The second source/drain region of the fourth transistor 210 is coupled to a fourth node 212. The fourth node 212 is coupled to a first source/drain region of a fifth transistor 213 and to a first source/drain region of a sixth transistor 214. The gate of the fifth transistor 213 is coupled to a third data input 215. A second source/drain region of the fifth transistor 213 is coupled to a fifth node 216. The fifth node 216 forms the first output connection 216 for the multiplexer 251. The gate of the second transistor 214 is coupled to a fourth data input 217, which is differential with respect to the third data input 215. A second source/drain region of the sixth transistor 214 is coupled to the sixth node 206. The sixth node 206 forms a second output connection 206 for the multiplexer 251.

The second node 204 is coupled to the fifth node 216. In addition, the second node 204 is coupled to a first peaking coil 217. The first peaking coil 217 is also coupled to a connection on a voltage source 253 by means of a first resistor 218.

The fifth node 216 is also coupled to a first line 219, which forms a first line 219 from the first output connection 216 of the multiplexer 251 to a first data output connection 252.

The sixth node 206 is also coupled to a second peaking coil 220 and to a second line 221, which forms a second line 221 from the second output connection 206 of the multiplexer 251 to a second data output connection 254. The second peaking coil 220 is also coupled to the connection of the voltage source 253 by means of a second resistor 222.

The first output connection 216 is coupled to a seventh node 223. The seventh node 223 is coupled to a first capacitance 224, which essentially represents the parasitic capacitances of the output circuit (transistors). In addition, the seventh node 223 is coupled to a first series-connected, monolithic inductance 225, which is also coupled to an eighth node 226. The eighth node 226 is coupled to a second capacitance 227, which essentially represents the parasitic capacitances of the first data output connection 252. In addition, the eighth node 226 is coupled to a first data output 228.

The second output connection 206 is coupled to a ninth node 229. The ninth node 229 is coupled to a third capacitance 230, which essentially represents the parasitic capacitances of the output circuit (transistors). In addition, the ninth node 229 is coupled to a second series-connected, monolithic inductance 231, which is also coupled to a tenth node 232. The tenth node 232 is coupled to a fourth capacitance 233, which essentially represents the parasitic capacitances of the second data output connection 254. In addition, the tenth node 232 is coupled to a second data output 234.

Figure 3:
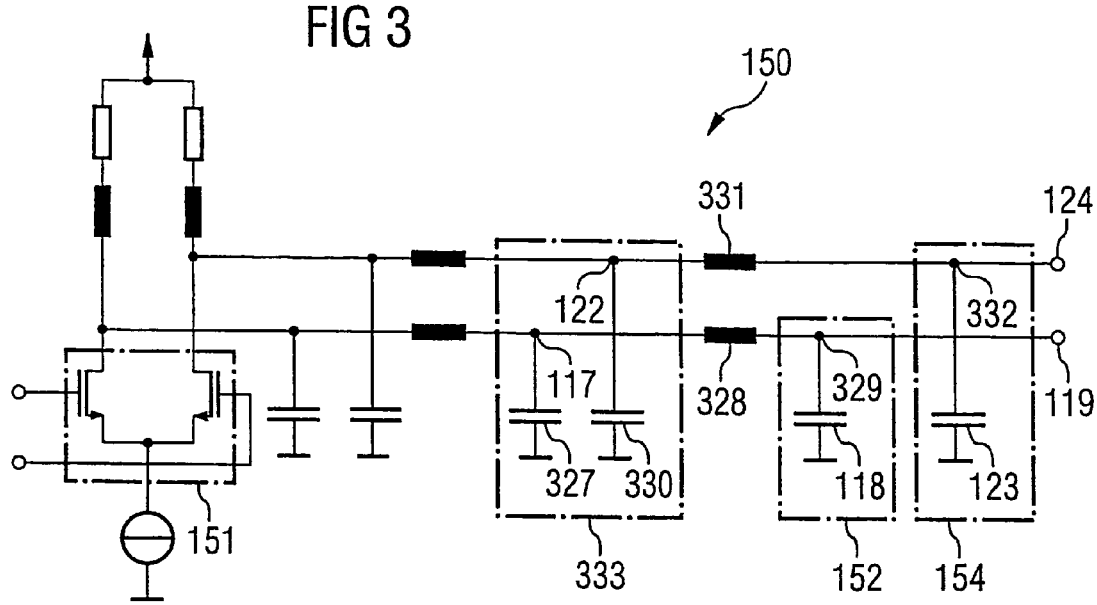
FIG. 3 illustrates a schematic diagram of a circuit arrangement based on a third exemplary embodiment of the invention.

FIG. 3 illustrates a third exemplary embodiment of the invention. The exemplary embodiment is the same as the first exemplary embodiment of the invention in FIG. 1, apart from in two points. First, the fifth node 117 is coupled to a fifth capacitance 327 and to a third series-connected, monolithic inductance 328. The third series-connected, monolithic inductance 328 is coupled to an eighth node 329, which is coupled to the first data output 119 and to the second capacitance 118. Secondly, the seventh node 122 is coupled to a sixth capacitance 330 and to a fourth series-connected, monolithic inductance 331. The fourth series-connected, monolithic inductance 331 is coupled to a ninth node 332, which is coupled to the second data output 124 and to the fourth capacitance 123. The fifth capacitance 327 and the sixth capacitance 330 are parasitic capacitances which are caused by electrostatic discharge (ESD) apparatus 333, for example, which ESDs are used to protect the integrated circuit arrangement from external charges.

In the third exemplary embodiment, the first capacitance 116, the fifth capacitance 327 and the first series-connected, monolithic inductance 125 are used to produce a first π filter.

The fifth capacitance 327, the second capacitance 118 and the third series-connected, monolithic inductance 328 are used to produce a second π filter. The third capacitance 121, the sixth capacitance 330 and the second series-connected, monolithic inductance 126 are used to produce a third π filter. The sixth capacitance 330, the fourth capacitance 123 and the fourth series-connected, monolithic inductance 331 are used to produce a fourth π filter.

The first π filter is connected to the second π filter in series. The third π filter is connected to the fourth π filter in series.

Figure 4:
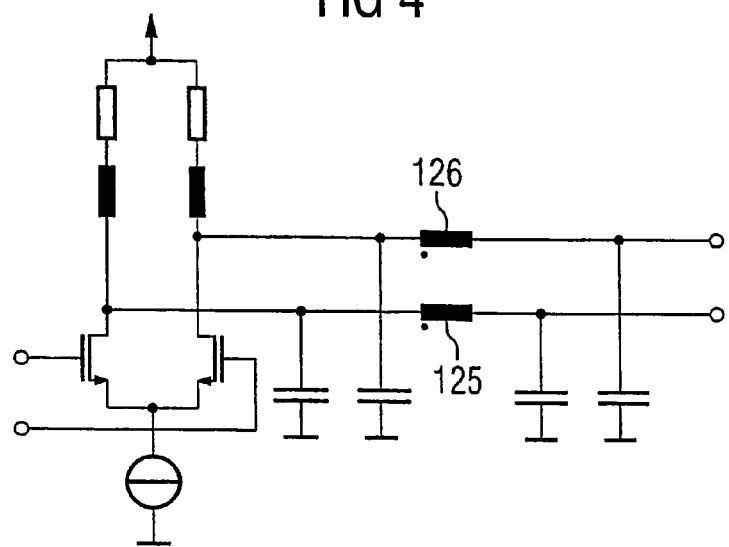
FIG. 4 illustrates a schematic diagram of a circuit arrangement based on a fourth exemplary embodiment of the invention.

FIG. 4 illustrates a fourth exemplary embodiment of the invention. The exemplary embodiment is the same as the first exemplary embodiment of the invention in FIG. 2, apart from the fact that in the fourth exemplary embodiment the first series-connected, monolithic inductance 125 is coupled to the second series-connected, monolithic inductance 126.

In the case of a differential output signal provided by the output circuit, coupling the two series-connected, monolithic inductances has the advantage that it is possible to save space when the same inductance is available, since the inductances 125 and 126 are available for both output signals from the output stage.

Figure 5:
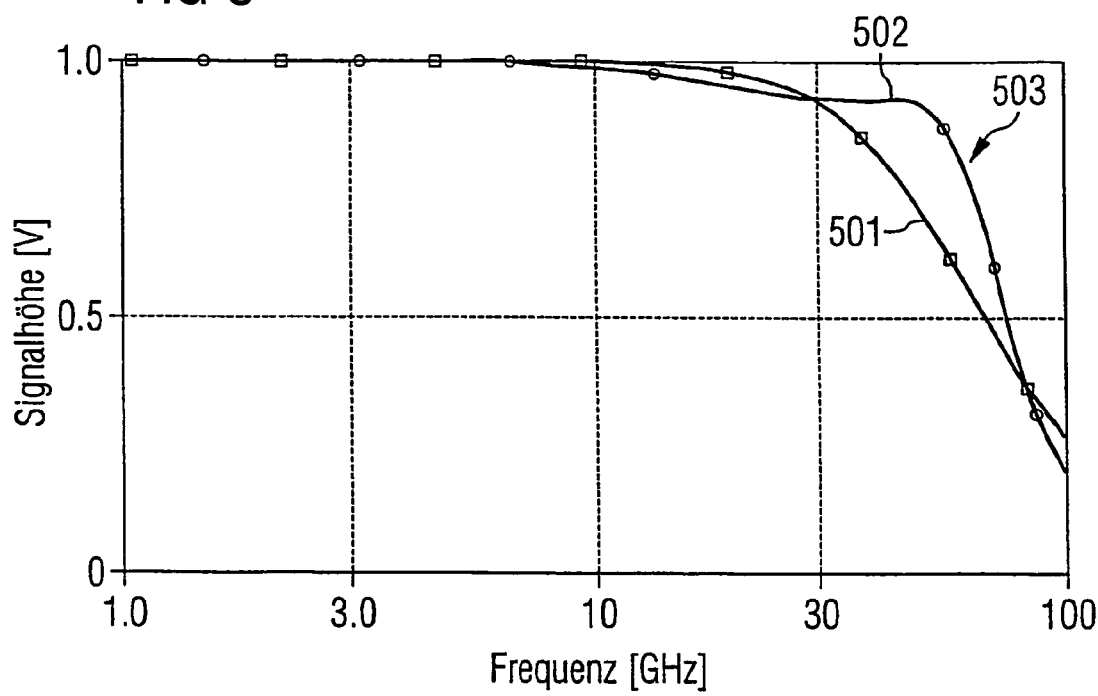
FIG. 5 illustrates a graph which shows the profiles of a signal over a frequency of the signal for a circuit arrangement with and without series inductance.

FIG. 5 compares the results of simulations with one another. It plots the voltage (signal level) available at the output of the circuit arrangement over the frequency of the signal. A first simulation 501 has been performed for a circuit arrangement based on the prior art without a series-connected, monolithic inductance. A second simulation 502 has been performed for a circuit arrangement based on the first exemplary embodiment of the invention. It can clearly be seen that in the inventive circuit arrangement the signal level has a steeper drop 503 at high frequencies. However, this steeper drop 503 does not appear until at higher frequencies than in a circuit arrangement based on the prior art. The increase in the signal in the inventive circuit arrangement between approximately 30 GHz and approximately 50 GHz results in the available bandwidth being significantly increased. The graph thus shows that the use of a series-connected, monolithic inductance significantly increases the usable bandwidth of an output stage.

Figure 6A:
FIG. 6A illustrates an eye graph for a circuit arrangement without peaking coils based on the prior art.

FIG. 6A illustrates an "eye graph" of a simulated circuit arrangement based on the prior art without peaking coils. The important parameters of a data signal can be derived from the eye graph. The eye graph is produced by superimposing similar "1" and "0" sequences of the data signal on a screen of an oscilloscope. As a result of a large number of individual bits being superimposed, the eye graph normally shows an unfocused image. The reason for this is the overshoots which exist and a signal jitter caused by band limiting. FIG. 6A shows a relatively shallow rise in the signal. The "eye" there fore has only a relatively small opening.

Figure 6B:
FIG. 6B illustrates an eye graph for a circuit arrangement with peaking coils based on the prior art.

FIG. 6B illustrates an "eye graph" for a simulated circuit arrangement based on the prior art with peaking coils. In contrast to FIG. 6A, the eye in FIG. 6B is further open. This indicates an improvement in the quality of the circuit arrangement. The rise in the signal continues to be shallow or slow, however. This means that a threshold is reached (which occurrence is assessed as a signal) only after a certain time.

Figure 6C:
FIG. 6C illustrates an eye graph for an inventive circuit arrangement with peaking coils and series inductances.
Figure 7:
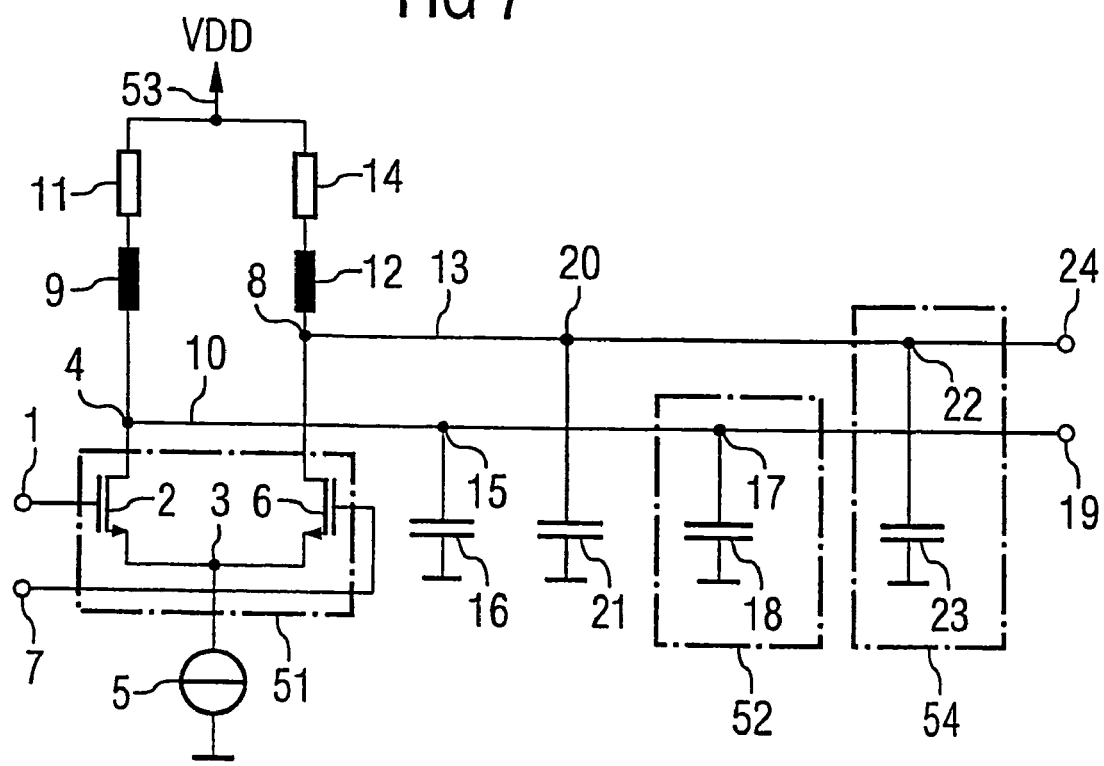
FIG. 7 illustrates a schematic diagram of an output stage based on the prior art.

FIG. 6C illustrates an "eye graph" for a simulated circuit arrangement based on the first exemplary embodiment of the invention. The eye shown is wide open. The rise in the signal in the eye's initial range is much steeper than in FIG. 6B. The inventive circuit arrangement having at least one series-connected, monolithic inductance significantly increases the usable frequency band. It is also possible to see that a sampling rate for the signal and hence a data transmission rate could be increased, since the signal jitters are small and the gradient of the rise in the signal is sufficient in order to increase the sampling rate.

In summary, the invention provides a circuit arrangement for an output stage which clearly uses at least one monolithic inductance (which is connected in series with the output circuit) to increase the usable bandwidth of the output stage significantly when the limiting element for the bandwidth is the parasitic capacitances.

The invention may be used for all types of broadband output circuits, e.g. including for driver circuits or latch circuits, which can be designed in CML technology using bipolar transistors, for example. The invention may also be used for any desired semiconductor technology, such as SiGe, InP, GaAs or other compound semiconductors on which inductances can be produced.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An integrated circuit arrangement comprising:
    an output circuit having at least one first output connection which can provide a data signal;
    at least one first data output connection; and
    at least one first inductance connected between the at least one first output connection and the at least one first data output connection, wherein at least one of the at least one first inductance is a monolithically integrated inductance.

2. The integrated circuit arrangement of claim 1, comprising:
    wherein the output circuit has a second output connection and a second data output connection; and
    at least one second inductance connected between the second output connection and the second data output connection.

3. The integrated circuit arrangement of claim 2, comprising where the first inductance is in a form such that it forms a first frequency filter having a prescribed frequency band together with the first data output connection, and the second inductance is in a form such that it forms a second frequency filter having the prescribed frequency band together with the second data output connection.

4. The integrated circuit arrangement of claim 3, comprising where the prescribed frequency band is in a range from 1 GHz to 100 GHz.

5. The integrated circuit arrangement of claim 1, comprising:
    a plurality of frequency filters coupled in series between the at least first output connection and the at least first data output connection.

6. The integrated circuit arrangement of claim 2, comprising where the output circuit is set up such that a differential data signal can be provided at the first output connection and at the second output connection.

7. The integrated circuit arrangement of claim 6, comprising where the at least one first inductance is coupled to the at least one second inductance.

8. The integrated circuit arrangement of claim 1, comprising where the output circuit has a differential amplifier.

9. The integrated circuit arrangement of claim 1, comprising where the output circuit has a multiplexer.

10. The integrated circuit arrangement of claim 2, wherein at least one of the at least one second inductance is a monolithically integrated inductance.

11. An integrated circuit arrangement comprising:
an output circuit having at least one first output connection which can provide a data signal;
a first data output connection;
a first inductance connected between the first output connection and the first data output connection; and
wherein the output circuit has a second output connection and a second data output connection and a second inductance connected between the second output connection and the second data output connection,
wherein at least one of the inductances is a monolithically integrated inductance.

12. The integrated circuit arrangement of claim 11, comprising where the first inductance is configured such that it forms a first frequency filter having a prescribed frequency band together with the first data output connection, and the second inductance is configured such that it forms a second frequency filter having the prescribed frequency band together with the second data output connection.

13. The integrated circuit arrangement of claim 12, comprising where the prescribed frequency band is in a range from 1 GHz to 100 GHz.

14. An integrated circuit arrangement comprising:
an output circuit having at least one first output connection which can provide a data signal;
at least one first data output connection;
at least one first inductance connected between the at least one first output connection and the at least one first data output connection, wherein at least one of the at least one first inductance is a monolithically integrated inductance; and
a plurality of frequency filters coupled in series between the at least first output connection and the at least first data output connection.

15. The integrated circuit arrangement of claim 14, wherein the output circuit has a second output connection and a second data output connection and at least one second inductance connected between the second output connection and the second data output connection, the output circuit set up such that a differential data signal can be provided at the first output connection and at the second output connection.

16. The integrated circuit arrangement of claim 15, comprising where the at least one first inductance is coupled to the at least one second inductance.

17. The integrated circuit arrangement of claim 16, comprising where the output circuit has a differential amplifier.

18. The integrated circuit arrangement of claim 15, wherein at least one of the at least one second inductance is a monolithically integrated inductance.

* * * * *

UNITED STATES PATENT AND TRADEMARK OFFICE
CERTIFICATE OF CORRECTION

| | |
|---|---|
| PATENT NO. | : 7,576,619 B2 |
| APPLICATION NO. | : 10/520805 |
| DATED | : August 18, 2009 |
| INVENTOR(S) | : Kehrer et al. |

It is certified that error appears in the above-identified patent and that said Letters Patent is hereby corrected as shown below:

Cover Page, after "Prior Publication Data" insert item (30)

--Foreign Application Priority Data

July 12, 2002   (DE) ....................... 102 31638--.

Signed and Sealed this

Eighteenth Day of May, 2010

David J. Kappos
*Director of the United States Patent and Trademark Office*